United States Patent
Hsu et al.

(10) Patent No.: US 8,981,485 B2
(45) Date of Patent: Mar. 17, 2015

(54) POWER TRANSISTOR HAVING A TOP-SIDE DRAIN AND FORMING METHOD THEREOF

(71) Applicant: Super Group Semiconductor Co., Ltd., New Taipei (TW)

(72) Inventors: Hsiu-Wen Hsu, Hsinchu County (TW); Chun-Ying Yeh, Hsinchu (TW); Yuan-Ming Lee, Taichung (TW)

(73) Assignee: Super Group Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 13/975,436

(22) Filed: Aug. 26, 2013

(65) Prior Publication Data

US 2014/0361362 A1 Dec. 11, 2014

(30) Foreign Application Priority Data

Jun. 5, 2013 (TW) .............................. 102119911 A (51) Int. Cl.
*H01L 29/66* (2006.01)
*H01L 29/78* (2006.01)

(52) U.S. Cl.
CPC ...... *H01L 29/7813* (2013.01); *H01L 29/66734* (2013.01)
USPC .................................. 257/365; 257/E29.242

(58) Field of Classification Search
CPC ..................... H01L 29/4236; H01L 29/42372; H01L 29/42376; H01L 29/66734; H01L 29/781
USPC ............................................ 257/365, E29.242
See application file for complete search history.

(56) References Cited

U.S. PATENT DOCUMENTS

| | | | | |
|---|---|---|---|---|
| 6,870,220 B2 * | 3/2005 | Kocon et al. | ................... | 257/340 |
| 7,449,762 B1 * | 11/2008 | Singh | .............................. | 257/493 |
| 7,932,556 B2 * | 4/2011 | Pan | ................................. | 257/330 |
| 2012/0068231 A1 * | 3/2012 | Garnett | ......................... | 257/263 |

* cited by examiner

*Primary Examiner* — Trung Q Dang
(74) *Attorney, Agent, or Firm* — Li & Cai Intellectual Property (USA) Office (57) ABSTRACT

A power transistor having a top-side drain and a forming method thereof are provided. Firstly, a body layer is formed. An epitaxial layer is subsequently formed on the body layer. Then a gate trench is formed in the body layer and the epitaxial layer. Afterward, a gate structure is formed in the gate trench. Then, a doped drain layer is formed within the epitaxial layer. Next, a source is formed in contact with the body layer. Lastly, a drain is formed in contact with the dope drain layer. The structure and forming method disclosed can through arranging the drain at the top of the power transistor integrate with the newly high performance packaging design structure. Accordingly, the efficiency of the power transistor can be greatly enhanced.

12 Claims, 8 Drawing Sheets

POWER TRANSISTOR HAVING A TOP-SIDE DRAIN AND FORMING METHOD THEREOF

BACKGROUND

1. Technical Field

The present disclosure relates to a power transistor, in particular, to a power transistor having a top-side drain.

2. Description of Related Art

Nowadays, mobile electronic device have become increasingly smaller in size causing the internal power transistor not only required to have higher efficiency but also required to have valid design structure to accommodate the development of high performance and high density packaging method. However, the traditional trench power transistor has a bottom-side drain, which makes difficult to connect for the traditional trench power transistor to be integrated with a novel high performance packaging design.

SUMMARY

Accordingly, an exemplary embodiment of the present disclosure provides a power transistor having a top-side drain, which can be integrated with the novel high performance package design.

According to one exemplary embodiment of the present disclosure, a power transistor having a top-side drain is provided. The power transistor comprises a body layer, an epitaxial layer formed on the body layer, a gate trench formed in the body layer and the epitaxial layer, a gate structure formed in the gate trench, a doped drain layer formed in the epitaxial layer, a source formed in contact with the body layer, and a drain formed in contact with the doped drain layer.

According to one exemplary embodiment, the power transistor further comprises a first shielding layer, which is formed in the gate trench and on the gate structure.

According to one exemplary embodiment, the power transistor further comprises a source trench, which is formed in the body layer and the epitaxial layer. The source trench has a conducting structure formed therein, so that the source is in contact with the body layer through the conducting structure.

According to one exemplary embodiment, the conducting structure is formed in the body layer.

According to one exemplary embodiment, the power transistor further comprises a second shielding layer, which is formed in the source trench and on the conducting structure.

According to one exemplary embodiment, the power transistor further comprises a source trench, which is formed in the body layer and a base layer. The base layer is formed under the body layer. The source trench has a conducting structure formed therein, so that the source is in contact with the body layer through the conducting structure.

According to one exemplary embodiment of the present disclosure, a forming method of a power transistor having a top-side drain is provided. The forming method comprises the steps of: a) forming a body layer; b) forming an epitaxial layer on the body layer; c) forming a gate trench in the body layer and the epitaxial layer; d) forming a gate structure in the gate trench; e) forming a doped drain layer in the epitaxial layer; f) forming a source in contact with the body layer; and g) forming a drain in contact with the doped drain layer.

According to one exemplary embodiment, after forming the gate structure, the forming method further comprises the step of: forming a first shielding layer in the gate trench and on the gate structure.

According to one exemplary embodiment, after forming the doped drain layer, the forming method further comprise the steps of: forming a source trench in the body layer and the epitaxial layer, and filling a conducting structure into the source trench, so that the source is in contact with the body layer through the conducting structure.

According to one exemplary embodiment, before filling the conducting structure into the source trench, the forming method further comprises the step of: forming a P-type layer in the body layer and a N-type layer in the body layer.

According to one exemplary embodiment, the conducting structure is formed in the body layer.

According to one exemplary embodiment, after filling the conducting structure into the body layer, the forming method further comprises the step of: forming a second shielding layer in the source trench and on the conducting structure.

According to one exemplary embodiment, the forming method further comprise the steps of: forming a source trench in the body layer and a base layer, wherein the base layer is formed under the body layer and filling a conducting structure into the source trench, so that the source is in contact with the body layer through the conducting structure.

According to one exemplary embodiment, the step of forming the body layer further comprises: sequentially forming a first P-type layer, a first N-type layer, and a second P-type layer.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

The main technical feature of the present disclosure is to design a power transistor having top side drain and develop various source designs to have the source in contact with the body layer. For example, have the source directly formed in contact with the body layer or through the formation of the source trench, with addition of a shielding layer for utilizing the potential pinching effect generated from the trench oxide under reverse bias operation to achieve charge balance and reduced surface field (RESURF) effects. Such that electrical characteristics of high breakdown voltage and low on resistance (Ronsp) can be efficiently obtained with lesser space, thereby effectively reduce the conduction loss of the element.

As shown in FIGS. 1A-1H, FIGS. 1A-1H respectively show exemplary diagrams illustrating a forming method of a power transistor having a top-side drain provided according to an exemplary embodiment of the present disclosure.

Figure 1A:
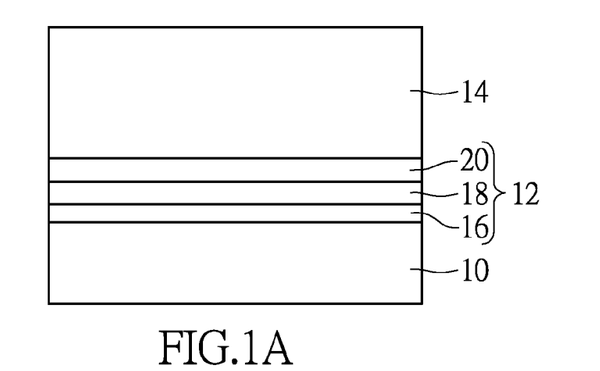
FIGS. 1A-1H respectively are exemplary diagrams of a forming method for a power transistor having a top-side drain provided according to an exemplary embodiment of the present disclosure.

Please refer to FIG. 1A. A base layer 10, a body layer 12, and an epitaxial layer 14 are sequentially formed. Specifically, the body layer 12 is formed on the base layer 10. The epitaxial layer 14 is formed on the body layer 12. The body layer 12, for example, may comprise of a first P-type layer (e.g., P-Body layer or PBL) 16, a first N-type layer 18, and a second P-type layer 20.

Figure 1B:
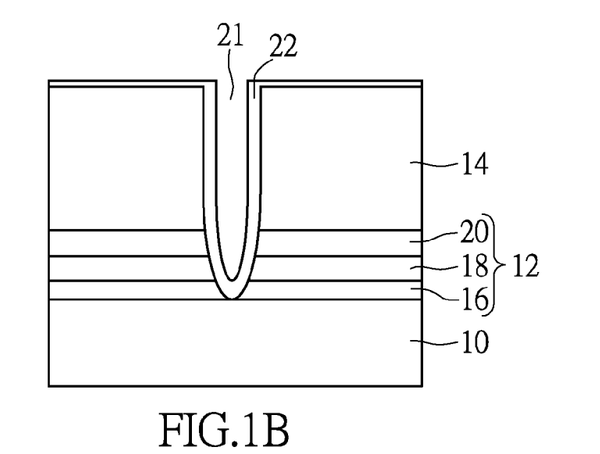

Next, referring to FIG. 1B, a gate trench 21 is formed in the body layer 12 and the epitaxial layer 14. The forming method of the gate trench 21 may for example, performing a masked partial etch process to form the gate trench 21. Then, a gate oxide layer 22 is formed in the gate trench 21.

Figure 1C:
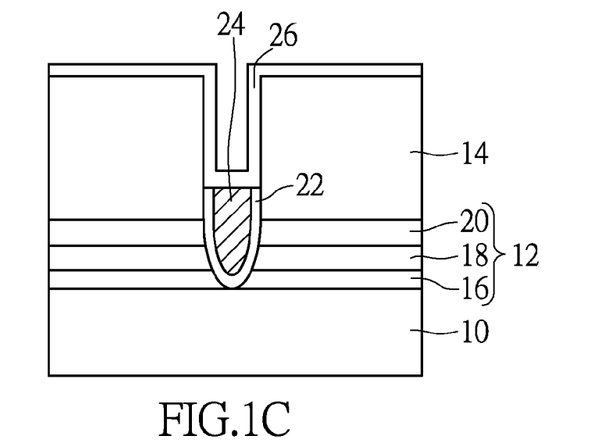

Referring to FIG. 1C, material such as poly-silicon is further deposited in the gate trench 21 to form a gate structure 24. An oxide layer is subsequently deposited on the gate structure 24 while being close to the side-wall of the gate trench 21 to form an internal dielectric layer 26.

Figure 1D:
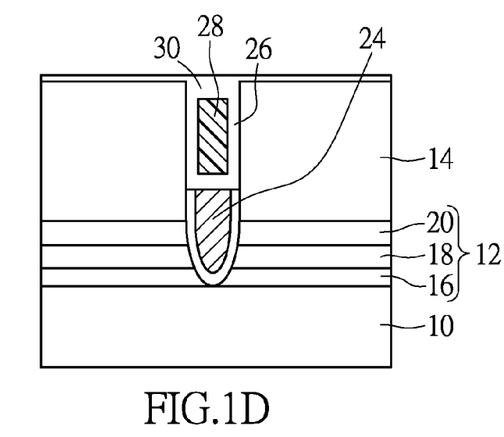

Next, a shielding layer 28 is formed in the gate trench 21 and on the gate structure 24 as shown in FIG. 1D. Then, an oxide layer 30 is deposited covering the shielding layer 28 and the epitaxial layer 14.

Figure 1E:
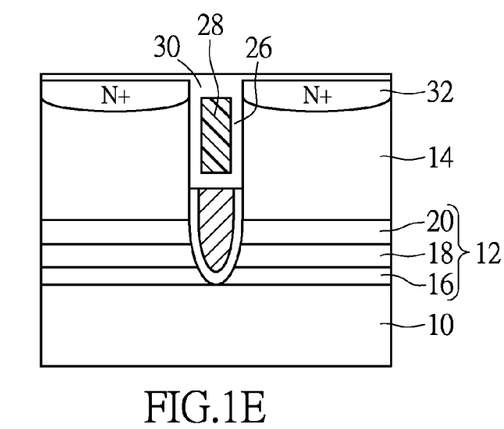

Next, referring to FIG. 1E, an ion implantation is performed to form a doped drain layer 32. In the present embodiment, the doped drain layer 32 may be a N+ type doped drain layer formed in the epitaxial layer 14 that is outside of the shielding layer 28.

Figure 1F:
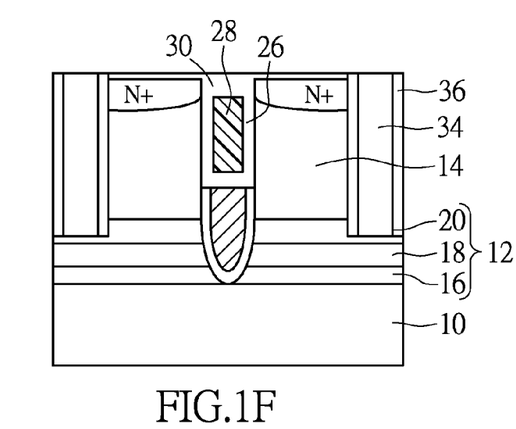

Next, referring to FIG. 1F, a source trench 34 is formed in the body layer 12 and the epitaxial layer 14. In the present embodiment, the bottom of the source trench 34 is designed to form in the second P-type layer 20 of the body layer 12. Afterward, deposits oxides in the source trench 34 to form a sidewall 36 for isolation effect.

Figure 1G:
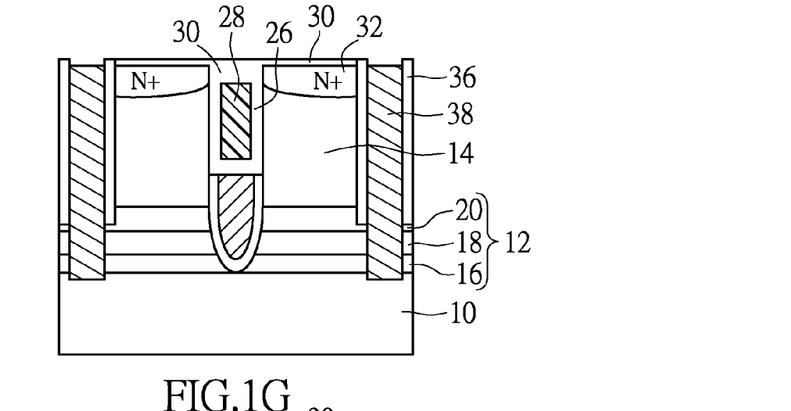

Next, referring to FIG. 1G, etches down deeper into the body layer 12 or even deeper to the base layer 10 through the source trench 34 to expose the first P-type layer 16, the first N-type layer 18, and the second P-type layer 20. A conducting structure 38 is subsequently filled into the source trench 34, wherein the conducting structure 38 may comprise of wolfram.

Figure 1H:
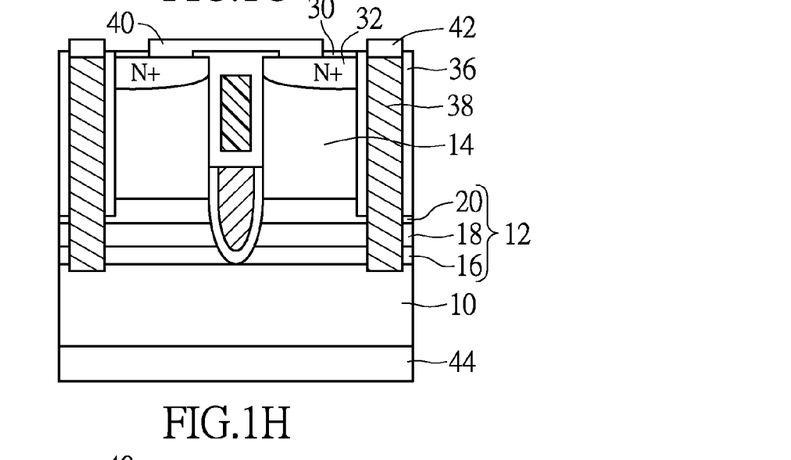

Next, referring to FIG. 1H, perform a partial etch process to the oxide layer 30 on the N+ type doped drain layer 32 to form a contact window. A drain 40 is subsequently formed on the contact window while a source 42 is formed on the conducting structure 38. The source 42 is in contact with the body layer 12 through the conducting structure 38. In addition, a contact layer 44 may be formed beneath the base layer 10 after the implementation of FIG. 1H. Or, the contact layer 44 may be stacked with the base layer 10 during the process illustrated in FIG. 1A and perform the rest of the manufacturing processes thereafter.

Figure 2A:
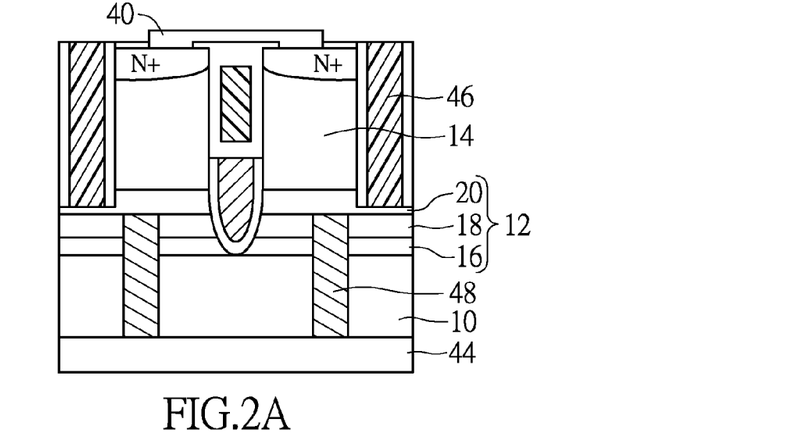
FIG. 2A is a diagram of a power transistor having a top-side drain provided according to another exemplary embodiment of the present disclosure.

As shown in FIG. 1H, the source 42 is in contact with the body layer 12 through the conducting structure 38, and the source 42 and the drain 40 are formed on the same side, such as all on the top-side. As shown in FIG. 2A, FIG. 2A shows a diagram of the power transistor having a top-side drain provided according to another exemplary embodiment of the present disclosure. In the instant embodiment, the source (i.e. the contact layer 44) and the drain 40 is formed on different sides. In the instant structure, a source trench 48 is formed in the body layer 12 and the base layer 10. The base layer 10 is formed under the body layer 12 or on another side opposite to the epitaxial layer 14. Then, a conducting structure is filled into the source trench 48. The contact layer 44 is configured as the source so that the source (i.e. the contact layer 44) is in contact with the body layer 12 through the conducting structure. Certainly, an isolation layer 46 can be disposed on the peripheral region to achieve isolation effect between any two elements.

Figure 2B:
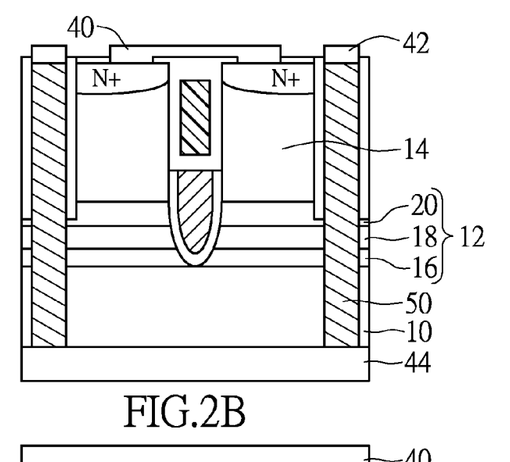
FIG. 2B is a diagram of a power transistor having a top-side drain provided according to another exemplary embodiment of the present disclosure.

FIG. 2B shows a diagram illustrating the power transistor having a top-side drain provided according to another exemplary embodiment of the present disclosure. As shown in FIG. 2B, a source trench 50 is not only formed in the body layer 12 and the epitaxial layer 14, but also penetrates the base layer 10. So that the conducting structure filled in the source trench 50 is connected to the source 42 and the contact layer 44 forming a transistor structure having the source on both sides.

Figure 3A:
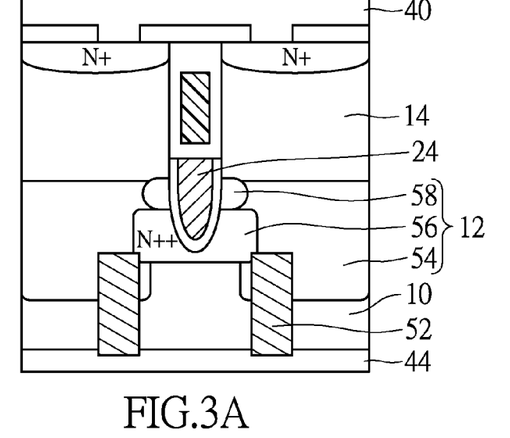
FIG. 3A is a diagram of a power transistor having a top-side drain provided according to another exemplary embodiment of the present disclosure.

FIG. 3A shows a diagram of a power transistor having a top-side drain provided according to another exemplary embodiment of the present disclosure. Referring to FIG. 3A, the base layer 10 and the body layer 12 are not limited to formation method depicted in FIG. 1A. As shown in FIG. 3A, the body layer 12 comprises a first P-type layer 54, a first N-type layer 56 (the concentration is, for example, N++), and a second P-type 58. The first P-type layer 54 is formed between the base layer 10 and the epitaxial layer 14, and on the peripheral region stacked by the base layer 10, the first N-type layer 56, and the second P-type layer 58. The gate structure 24 is formed in the first N-type layer 56 and the second P-type layer 58. One end of the conducting structure of the source trench 52 is in contact with the first P-type layer 54 and the first N-type layer 56. Another end of the conducting structure of the source trench 52 is in contact with the contact layer 44, which is configured as the source.

Figure 3B:
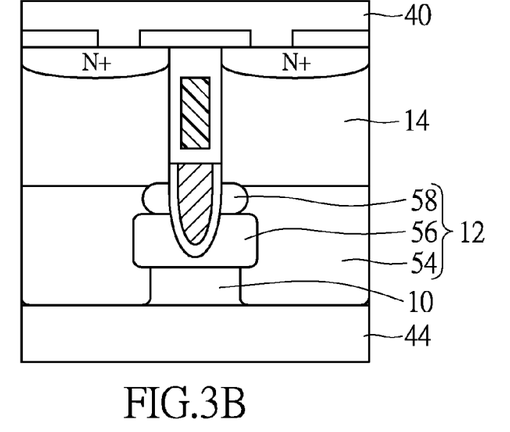
FIG. 3B is a diagram of a power transistor having a top-side drain provided according to another exemplary embodiment of the present disclosure.

Referring to FIG. 3B, which shows a diagram of a power transistor having a top-side drain provided according to another exemplary embodiment of the present disclosure. Parts of FIG. 3B that is similar to FIG. 3A are omitted herein for simplicity. The difference are in that the contact layer 44 being configured as the source is directly connected to the first P-type layer 54 and the base layer 10 without the need of forming the source trench structure, i.e., the source structure may vary so long as the source is in contact with the body layer.

Figure 4A:
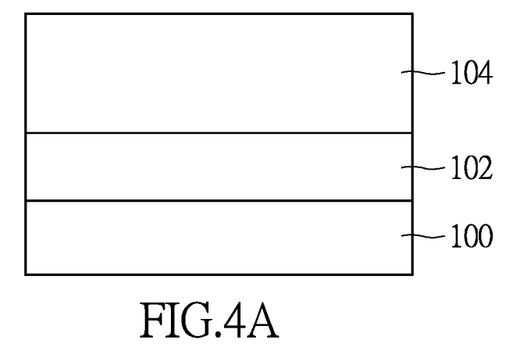
FIGS. 4A-4E respectively are diagrams of a forming method of a power transistor having a top-side drain provided according to another exemplary embodiment of the present disclosure.
Figure 4B:
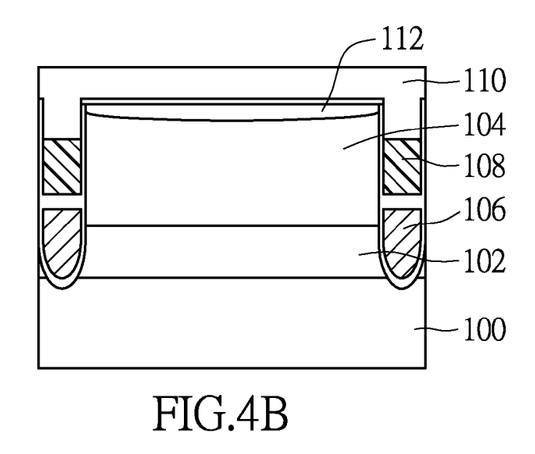

FIGS. 4A-4E respectively show diagrams illustrating a forming method of a power transistor having a top-side drain provided according to another exemplary embodiment of the present disclosure. Firstly, referring to FIG. 4A, a base layer 100, a body layer 102, and an epitaxial layer 104 are sequentially formed. Referring to FIG. 4B, a gate trench is subsequently formed in the body layer 102 and the epitaxial layer 104. Afterward, a gate structure 106 and a shielding layer 108 are separately formed in the gate trench. Moreover, an oxide layer 110 is formed on the shielding layer 108 and the epitaxial layer 104. Then, an ion implantation process is performed in the epitaxial layer 104 to form a doped drain layer 112.

Figure 4C:
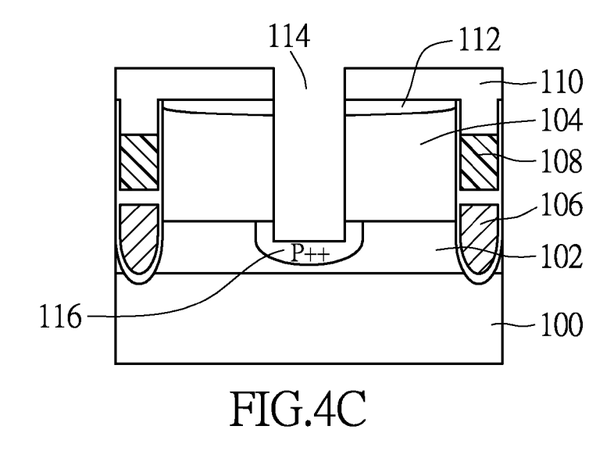

Next, referring to FIG. 4C, a source trench 114 is formed in the body layer 102 and the epitaxial layer 104. Then, implants P++ ions into the body layer 102, which is in contact with the source trench 114, to form a second P-type layer 116 of p++. The second P-type layer 116 is different from the body layer 102 (i.e., the first P-type layer).

Figure 4D:
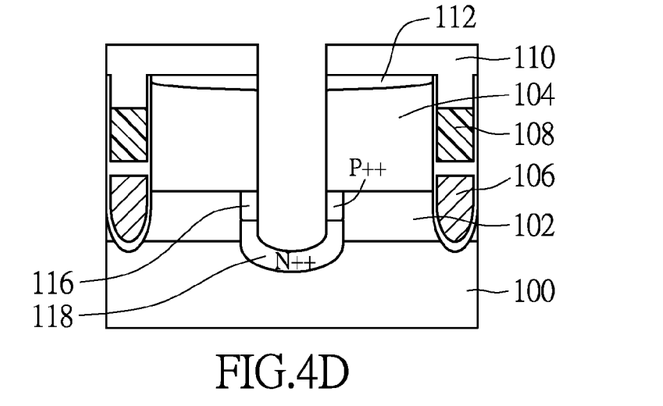

Next, referring to FIG. 4D, an etching process is employed to etch a portion of the second P-type layer 116 and a portion of the base layer 100 underneath. Then a N++ ion implantation process is performed thereafter to form a first N-type layer 118.

Figure 4E:
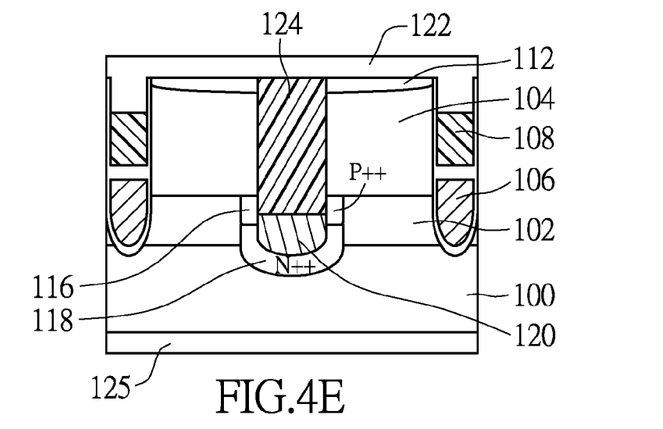

A conducting structure 120 is filled in the second P-type layer 116 and the N-type layer 118 as shown in FIG. 4E. The conducting structure 120 is in contact with the source. It shall be noted that FIG. 4E herein merely is a partial cross-section diagram, For a practical design, the conducting structure 120 may for example configured to connect to a top-side source or a bottom-side source 125. An oxide layer 124 is subsequently filled in the source trench. Lastly, a metal layer is formed on the oxide layer 124 serving as a drain 122 and the metal layer is in contact with the doped drain layer 112.

Figure 5:
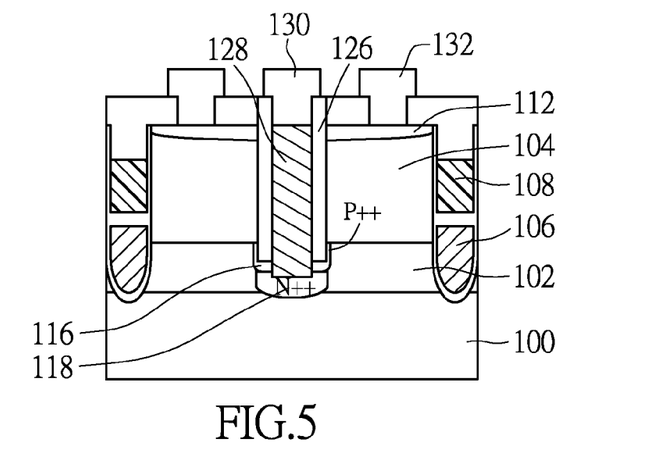
FIG. 5 is a diagram of a power transistor having a top-side drain provided according to another exemplary embodiment of the present disclosure.

Besides, FIG. 5 shows a diagram illustrating a power transistor having a top-side drain provided according to another exemplary embodiment of the present disclosure. FIG. 5 continues after the formation of the second P-type layer 116 doped of p++ in FIG. 4C. A sidewall 126, which is composed of oxides, is formed, and a portion of the second P-type layer 116 and the base layer 100 are subsequently etched. Afterward, a N++ ion implantation process is performed to form the first N-type layer 118. Lastly, a conducting structure 128 is filled into the source trench and is in contact with the top-side source 130 so that the source 130 and the drain 132 are formed on the same side.

Figure 6A:
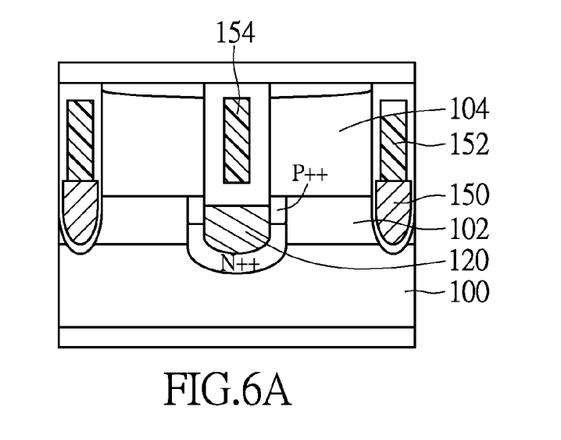
FIGS. 6A-6D respectively are exemplary diagrams illustrating various types of power transistors having top-side drain provided according to other exemplary embodiments of the present disclosure.
Figure 6B:
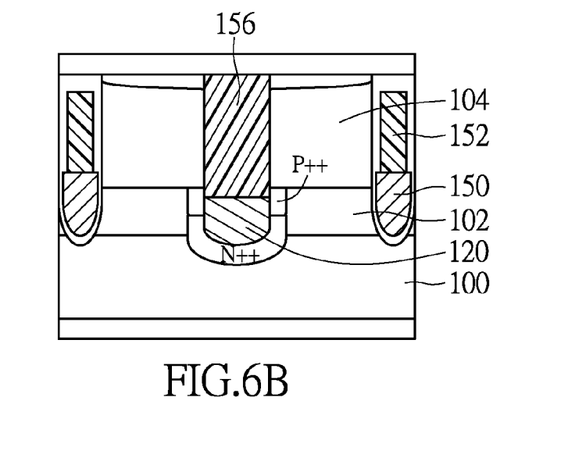
Figure 6C:
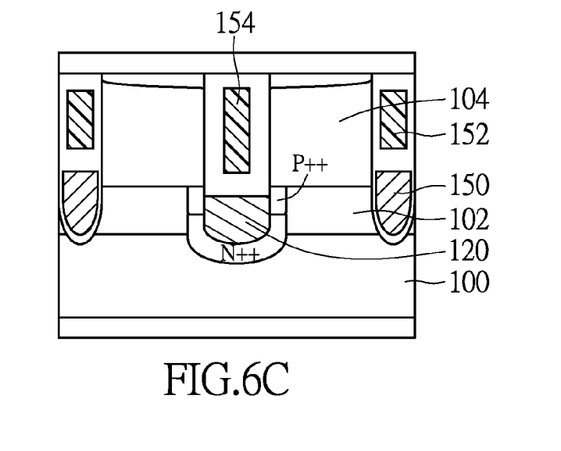
Figure 6D:
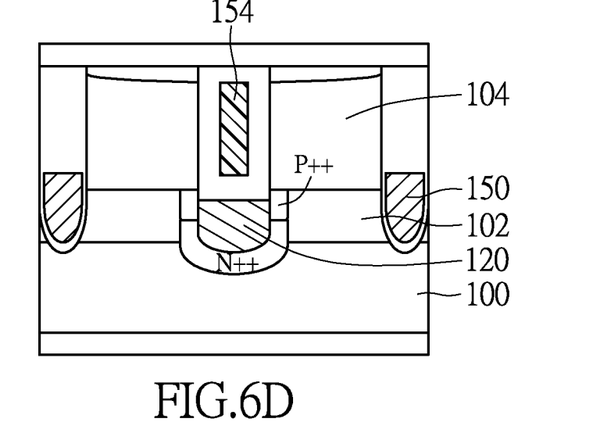

FIGS. 6A-6D show exemplary diagrams illustrating multiple types of power transistors having top-side drain provided according to other embodiments of the present disclosure. The difference between FIG. 6A and FIG. 4E are that a gate structure 150 and a shielding layer 152 can be connected to each other. A shielding layer 154 can be formed on the conducting structure 120, as shown in FIG. 6A. Next, the difference between FIG. 6A and FIG. 6B are as shown in FIG. 6B, oxides are directly formed on the conducting structure 120 serving as an isolation layer 156 without depositing the shielding layer 154. The gate structure 150 and the shielding layer 152 can be connected to each other. In FIG. 6C, the gate structure 150 and the shielding layer 152 are isolated from each other. The shielding layer 154 is formed on the conducting structure 120. In FIG. 6D, only the conducting structure 120 has the shielding layer 154 formed thereon, and no shielding layer 152 is formed above the gate structure 150.

According to the structure and related forming method disclosed, the power transistor structure can be integrated with the newly high performance packaging design structure through forming the drain on the top side of power transistor structure. Accordingly, the efficiency of the power transistor can be greatly enhanced.

Based the above description, the present disclosure completely complies with the patentability requirements: novelty, non-obviousness, and utility. It will be apparent to those skilled in the art that various modifications and variations can be made to the structure of the invention without departing from the scope or spirit of the invention. In view of the foregoing descriptions, it is intended that the invention covers modifications and variations of this invention if they fall within the scope of the following claims and their equivalents.

What is claimed is:

1. A power transistor having a top-side drain, comprising:
   a body layer including at least one P-type layer and a N-type layer;
   an epitaxial layer, formed on the body layer;
   a gate trench, formed in the body layer and the epitaxial layer;
   a gate structure, formed in the gate trench;
   a doped drain layer, formed in the epitaxial layer;
   a source, formed in contact with the body layer; and
   a drain, formed in contact with the doped drain layer.

2. The power transistor according to claim 1, further comprising a first shielding layer formed in the gate trench and on the gate structure.

3. The power transistor according to claim 1, further comprising a source trench formed in the body layer and the epitaxial layer, the source trench having a conducting structure formed therein so that the source is in contact with the body layer through the conducting structure.

4. The power transistor according to claim 3, wherein the conducting structure is formed in the body layer.

5. The power transistor according to claim 4, further comprising a second shielding layer formed in the source trench and on the conducting structure.

6. The power transistor according to claim 1, further comprising a source trench formed in the body layer and a base layer, the base layer being formed under the body layer, the source trench having a conducting structure formed therein, so that the source is in contact with the body layer through the conducting structure.

7. A forming method of a power transistor having a top-side drain, comprising:
   forming a body layer;
   forming an epitaxial layer on the body layer;
   forming a gate trench in the body layer and the epitaxial layer;
   forming a gate structure in the gate trench;
   forming a doped drain layer in the epitaxial layer;
   forming a source trench in the body layer and the epitaxial layer;
   forming a P-type layer in the body layer and a N-type layer in the body layer;
   subsequently, filling a conducting structure into the source trench;
   forming a source in contact with the body layer, wherein the source is in contact with the body layer through the conducting structure; and
   forming a drain in contact with the doped drain layer.

8. The forming method of the power transistor according to claim 7, wherein the step after forming the gate structure further comprises:
   forming a first shielding layer in the gate trench and on the gate structure.

9. The forming method of the power transistor according to claim 7, wherein the conducting structure is formed in the body layer.

10. The forming method of the power transistor according to claim 9, wherein the step after filling the conducting structure in the body layer comprises:
   forming a second shielding layer in the source trench and on the conducting structure.

11. The forming method of the power transistor according to claim 7, further comprising forming a source trench in the body layer and a base layer.

12. A forming method of a power transistor having a top-side drain, comprising:
   sequentially forming a first P-type layer, a first N-type layer, and a second P-type layer to form a body layer;
   forming an epitaxial layer on the body layer;
   forming a gate trench in the body layer and the epitaxial layer;
   forming a gate structure in the gate trench;
   forming a doped drain layer in the epitaxial layer;
   forming a source in contact with the body layer; and
   forming a drain in contact with the doped drain layer.

* * * * *